(12) United States Patent
Sasaki et al.

(10) Patent No.: US 10,490,249 B2
(45) Date of Patent: Nov. 26, 2019

(54) DATA WRITING METHOD, INSPECTION METHOD, SPIN DEVICE MANUFACTURING METHOD, AND MAGNETORESISTANCE EFFECT ELEMENT

(71) Applicant: TDK CORPORATION, Tokyo (JP)

(72) Inventors: Tomoyuki Sasaki, Tokyo (JP); Yohei Shiokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/068,792

(22) PCT Filed: Feb. 1, 2018

(86) PCT No.: PCT/JP2018/003451
§ 371 (c)(1),
(2) Date: Jul. 9, 2018

(87) PCT Pub. No.: WO2019/150532
PCT Pub. Date: Aug. 8, 2019

(65) Prior Publication Data
US 2019/0333560 A1 Oct. 31, 2019

(51) Int. Cl.
*G11C 11/16* (2006.01)
*H01F 10/32* (2006.01)
(Continued)

(52) U.S. Cl.
CPC ........ *G11C 11/1675* (2013.01); *G11C 11/161* (2013.01); *H01F 10/329* (2013.01);
(Continued)

(58) Field of Classification Search
CPC ............... G11C 11/1675; G11C 11/161; H01F 10/3254; H01F 10/3281; H01F 10/329;
(Continued)

(56) References Cited

U.S. PATENT DOCUMENTS 7,965,544 B2 * 6/2011 Kitagawa ............ G11C 11/1659
365/131
8,243,390 B2 * 8/2012 Jubert ...................... G11B 5/02
360/135

(Continued)

FOREIGN PATENT DOCUMENTS

JP 2012-203939 A 10/2012
JP 5441005 B2 3/2014
(Continued)

OTHER PUBLICATIONS

Magnetoresistive Random Access Memory, Dmytro Apalkov, Bernard et al., Proceedings of the IEEE | vol. 104,No. 10, Oct. 2016, all pages (Year: 2016).*

(Continued)

*Primary Examiner* — Fernando Hidalgo
(74) *Attorney, Agent, or Firm* — Oliff PLC (57) ABSTRACT

A data writing method is configured such that a spin device includes a conducting portion extending in a first direction and a device portion stacked on one surface of the conducting portion and including a non-magnetic layer and a ferromagnetic layer, wherein an energy equal to or smaller than an energy represented by a predetermined relational expression (1) is applied in the first direction of the conducting portion when the pulse width of an applied pulse is t.

14 Claims, 2 Drawing Sheets

(51) Int. Cl.
  *H01L 43/12* (2006.01)
  *H01L 43/02* (2006.01)
  *H01L 21/66* (2006.01)
  *H01L 43/10* (2006.01)

(52) U.S. Cl.
  CPC ..... *H01F 10/3254* (2013.01); *H01F 10/3281* (2013.01); *H01L 22/14* (2013.01); *H01L 43/02* (2013.01); *H01L 43/12* (2013.01); *H01L 43/10* (2013.01)

(58) Field of Classification Search
  CPC ......... H01L 22/14; H01L 43/02; H01L 43/12; H01L 43/10
  USPC ....................................................... 365/158
  See application file for complete search history.

(56) References Cited

U.S. PATENT DOCUMENTS

| | | | |
|---|---|---|---|
| 8,350,347 B2 | 1/2013 | Gaudin et al. | |
| 2007/0171694 A1* | 7/2007 | Huai | H01L 43/08 365/145 |
| 2008/0253174 A1* | 10/2008 | Yoshikawa | H01L 27/228 365/158 |
| 2011/0129691 A1 | 6/2011 | Ishiwata et al. | |
| 2012/0243303 A1 | 9/2012 | Shuto | |
| 2014/0085968 A1* | 3/2014 | Saida | G11C 11/161 365/158 |
| 2015/0348606 A1 | 12/2015 | Buhrman et al. | |
| 2017/0169872 A1 | 6/2017 | Yoda et al. | |
| 2017/0222135 A1 | 8/2017 | Fukami et al. | |

FOREIGN PATENT DOCUMENTS

| | | |
|---|---|---|
| JP | 2017-112351 A | 6/2017 |
| WO | 2016/021468 A1 | 2/2016 |
| WO | 2017/208576 A1 | 12/2017 |

OTHER PUBLICATIONS

Magnetoresistive Random Access Memory: The Path to Competitiveness and Scalability, Jian-Gang Zhu, Proceedings of the IEEE | vol. 96, No. 11, Nov. 2008, all pages (Year: 2008).*
S. Fukami et al. "A Spin-Orbit Torque Switching Scheme With Collinear Magnetic Easy Axis and Current Configuration". Nature Nanotechnology, Mar. 21, 2016, vol. 11, pp. 1-6.
Y.K. Kato et al. "Observation of the Spin Hall Effect in Semiconductors". Science Magazine, Dec. 10, 2004, vol. 306, pp. 1910-1913.
Ioan Mihai Miron et al. "Perpendicular Switching of a Single Ferromagnetic Layer Induced by In-Plane Current Injection". Nature, Aug. 11, 2011, vol. 476, pp. 189-194.
Luqiao Liu et al. "Spin Torque Switching With the Giant Spin Hall Effect of Tantalum". Science Magazine, Mar. 13, 2012, vol. 336.
Luqiao Liu et al. "Current-Induced Switching of Perpendicularly Magnetized Magnetic Layers Using Spin Torque From the Spin Hall Effect". Physical Review Letters, Aug. 31, 2012, vol. 109, pp. 096602-1 through 096602-5.
Ki-Seung Lee et al. "Threshold Current for Switching of a Perpendicular Magnetic Layer Induced by Spin Hall Effect". Applied Physics Letters, Mar. 25, 2013, vol. 102.
Ki-Seung Lee et al. "Thermally Activated Switching of Perpendicular Magnet by Spin-Orbit Spin Torque". Applied Physics Letters, Feb. 21, 2014, vol. 104, pp. 072413-1 through 072413-5.
Shunsuke Fukami et al. "Magnetization Switching by Spin-Orbit Torque in an Antiferromagnet-Ferromagnet Bilayer System". Nature Materials, May 2016, vol. 15, pp. 535-542.
S. Takahashi et al. "Spin Injection and Detection in Magnetic Nanostructures". Physical Review B, Feb. 28, 2003, vol. 67, pp. 052409-1 through 052409-4.
Yeongkyo Seo et al. "Area-Efficient SOT-MRAM With a Schottky Diode". IEEE Electron Device Letters, Aug. 2016, vol. 37, No. 8, pp. 982-985.
Wei Zhang et al. "Spin Hall Effects in Metallic Antiferromagnets". Physical Review Letters, Nov. 7, 2014, vol. 113, pp. 196602-1 through 196602-6.

* cited by examiner

DATA WRITING METHOD, INSPECTION METHOD, SPIN DEVICE MANUFACTURING METHOD, AND MAGNETORESISTANCE EFFECT ELEMENT

TECHNICAL FIELD

The present invention relates to a data writing method, an inspection method, a spin device manufacturing method, and a magnetoresistance effect element.

BACKGROUND ART

As a device which uses change in resistance (change in magnetoresistance) based on change in a relative angle of magnetization between two ferromagnetic layers, a giant magneto-resistance (GMR) device formed of a multi-layer film including a ferromagnetic layer and a non-magnetic layer, a tunneling magneto-resistance (TMR) device in which an insulating layer (a tunneling barrier layer and a barrier layer) is used for a non-magnetic layer, and the like are known.

In recent years, among spin devices (devices using spintronics) which use change in magneto-resistance, a spin-orbit torque-type magnetoresistance effect element which uses a spin-orbit torque (SOT) and a domain wall motion-type magnetic recording device which uses a motion of a domain wall have drawn attention.

For example, Non-Patent Document 1 discloses a spin-orbit torque-type magnetoresistance effect element. An SOT is induced by a pure spin current generated by a spin-orbit interaction or by the Rashba effect at the interface between different materials. A current for inducing an SOT in a magnetoresistance effect element is passed in a direction crossing the stacking direction of magnetoresistance effect elements. That is, since it is not necessary to pass a current in the stacking direction of these magnetoresistance effect elements, the service life of the magnetoresistance effect elements is expected to be able to be extended.

Moreover, for example, Patent Document 1 discloses a domain wall motion-type magnetic recording device. In a domain wall motion-type magnetic recording device, a domain wall in a magnetic recording layer is moved whereby a resistance changes in a stepwise manner. Since the resistance changes in a stepwise manner, it is possible to record multi-valued data. Moreover, it is possible to record analog data as well as recording digital data such as "0" and "1".

CITATION LIST

Patent Literature

Patent Document 1: Japanese Patent No. 5441005

Non-Patent Literature

Non-Patent Document 1: S. Fukami, T. Anekawa, C. Zhang and H. Ohno, Nature Nano Tec (2016). DOI:10.1038/NNANO. 2016. 29.

SUMMARY OF INVENTION

Technical Problem

In these spin devices, when writing data, it is not necessary to pass a current in a stacking direction of a device portion (a functional portion that exhibits a magnetoresistance effect and a magnetoresistance effect element). Due to this, it is considered that it is substantially not necessary to take an electrical breakdown of a device portion into consideration, and in principle, it is possible to pass a large writing current.

However, as a result of intensive study of the present inventors, it was found that, when a predetermined energy is applied to a conducting portion of a three-terminal-type spin device in which it is not necessary to pass a writing current in a stacking direction of a device portion, the resistance of the device portion decreases significantly.

The present invention has been made in view of the above-described problems, and an object thereof is to provide a data writing method capable of writing data stably and to provide a magnetoresistance effect element capable of realizing this writing method. Another object of the present invention is to provide an inspection method of screening devices using change in resistance of a device portion and a manufacturing method.

Solution to Problem

That is, the invention provides the following means in order to solve the above-mentioned problems.

(1) A data writing method according to a first aspect is configured such that a spin device includes a conducting portion extending in a first direction and a device portion stacked on one surface of the conducting portion and including a non-magnetic layer and a ferromagnetic layer, wherein an energy equal to or smaller than an energy E represented by a relational expression (1) is applied in the first direction of the conducting portion when a pulse width of an applied pulse is t:

$$E = (A + Bt^C)^{-1} + D \qquad (1)$$

in the relational expression (1), A, B, C, and D are constants determined by the non-magnetic layer.

(2) In the data writing method according to the above aspect, the non-magnetic layer may be MgO and in the relational expression (1), A=−0.18264, B=13.2554, C=0.22749, and D=0.2, or the non-magnetic layer may be $MgAl_2O_4$ and in the relational expression (1), A=−0.13792, B=6.98, C=0.20832, and D=0.2.

(3) In the data writing method according to the above aspect, the pulse width may be 1 sec or shorter and the energy applied in the first direction of the conducting portion may be 0.2 mΩA² or smaller.

(4) In the data writing method according to the above aspect, the conducting portion may be a spin-orbit torque wiring, and the device portion may include a first ferromagnetic layer, a second ferromagnetic layer, and a non-magnetic layer interposed between the first and second ferromagnetic layers.

(5) In the data writing method according to the above aspect, the conducting portion may be a magnetic recording layer having a domain wall, and the device portion may have a non-magnetic layer and a third ferromagnetic layer arranged in that order from the magnetic recording layer.

(6) An inspection method according to a second aspect is configured such that a spin device includes a conducting portion extending in a first direction and a device portion stacked on one surface of the conducting portion and including a non-magnetic layer and a ferromagnetic layer, wherein an energy equal to or smaller than an energy E represented by a relational expression (1) is applied in the first direction of the conducting portion when a pulse width of an applied pulse is t:

$$E=(A+Bt^C)^{-1}+D \qquad (1)$$

in the relational expression (1), A, B, C, and D are constants determined by the non-magnetic layer.

(7) In the inspection method according to the above aspect, the non-magnetic layer may be MgO and in the relational expression (1), A=−0.18264, B=13.2554, C=0.22749, and D=0.2, or the non-magnetic layer may be $MgAl_2O_4$ and in the relational expression (1), A=−0.13792, B=6.98, C=0.20832, and D=0.2.

(8) A spin device manufacturing method according to a third aspect includes a step of inspecting the spin device using the inspection method according to the above aspect.

(9) A magnetoresistance effect element according to a fourth aspect includes: a spin device including a conducting portion extending in a first direction and a device portion stacked on one surface of the conducting portion and including a non-magnetic layer and a ferromagnetic layer; and an energy source capable of applying an energy equal to or smaller than an energy E represented by a relational expression (1) in the first direction of the conducting portion when the pulse width of an applied pulse is t:

$$E=(A+Bt^C)^{-1}+D \qquad (1)$$

in the relational expression (1), A, B, C, and D are constants determined by the non-magnetic layer.

Advantageous Effects of Invention

According to the data writing method and the magnetoresistance effect element according to the present embodiment, it is possible to write data stably. Moreover, according to the inspection method and the manufacturing method according to the present embodiment, it is possible to easily screen devices using change in resistance of a device portion.

DESCRIPTION OF EMBODIMENTS

Hereinafter, the present embodiment will be described in detail with reference to the drawings. In the drawings used in the following description, in some cases, characteristic portions are enlarged for ease of understanding of the characteristics of the invention and the dimensions and scale of each component are different from the actual dimensions and scale. The materials and dimensions exemplified in the following description are illustrative and the invention is not limited thereto. The materials and dimensions can be appropriately changed without departing from the scope and spirit of the invention.

[Data Writing Method]

A data writing method according to the present embodiment is a method of applying energy equal to or smaller than predetermined energy to a conducting portion of a three-terminal-type spin device.

A three-terminal-type spin device includes a conducting portion extending in a first direction and a device portion stacked on one surface of the conducting portion and including a non-magnetic layer and a ferromagnetic layer. The three-terminal-type spin device writes data by passing a current along the conducting portion and reads data by passing a current between the device portion and one end of the conducting portion. The three-terminal-type spin device has two terminals for applying a writing current at positions of the conducting portion between which the device portion is interposed and one terminal for applying a reading current on an end surface of the device portion on the opposite side of the conducting portion. Hereinafter, a specific example of the three-terminal-type spin device will be described.

(Spin-Orbit Torque-Type Magnetoresistance Effect Element)

Figure 1:
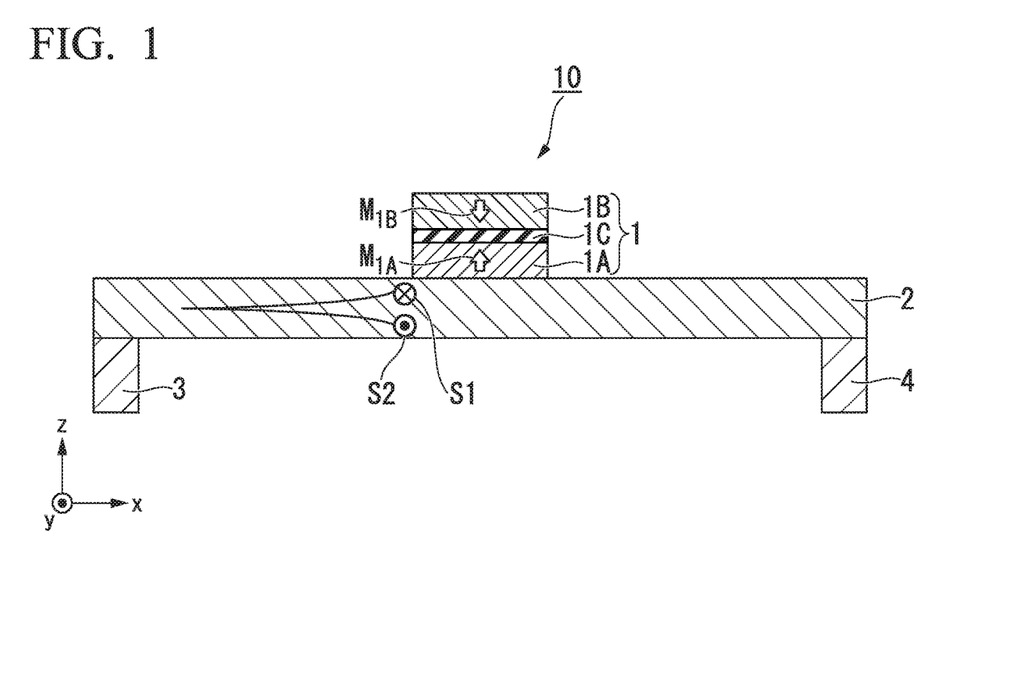
FIG. 1 is a cross-sectional schematic diagram of a spin-orbit torque-type magnetoresistance effect element which is an example of a spin device according to the present embodiment.

FIG. 1 is a cross-sectional schematic diagram of a spin-orbit torque-type magnetoresistance effect element 10 which is an example of a spin device according to the present embodiment. The spin-orbit torque-type magnetoresistance effect element 10 shown in FIG. 1 includes a device portion 1 and a spin-orbit torque wiring (a conducting portion) 2. A first electrode 3 and a second electrode 4 having conductive properties are provided at positions of the spin-orbit torque wiring 2 between which the device portion 1 is interposed.

Hereinafter, a first direction along which the conducting portion extends will be defined as an x direction, a stacking direction (a second direction) of the device portion 1 will be defined as a z direction, and a direction orthogonal to the x and z directions will be defined as a y direction.

<Spin-Orbit Torque Wiring>

The spin-orbit torque wiring 2 extends in the x direction. The spin-orbit torque wiring 2 is connected to one surface in the z direction of a first ferromagnetic layer 1A. The spin-orbit torque wiring 2 and the first ferromagnetic layer 1A may be connected directly to each other and may be connected with another layer disposed therebetween.

The spin-orbit torque wiring 2 is formed of a material that generates a spin current due to the spin Hall effect when a current I flows. As an example of such a material, a material that generates a spin current in the spin-orbit torque wiring 2 may be used. Therefore, such a material is not limited to a material made up of a single element, and a material including a portion formed of a material that easily generates a spin current and a portion formed of a material that does not easily generate a spin current may be used.

The spin Hall effect is a phenomenon that, when a current I is passed through a material, a spin current is induced in a direction orthogonal to the direction of the current I on the basis of the spin-orbit interaction. A mechanism in which a spin current is generated by the spin Hall effect will be described.

When a potential difference is applied across both ends of the spin-orbit torque wiring 2, a current I flows along the spin-orbit torque wiring 2. When the current I flows, a first spin S1 oriented in one direction and a second spin S2 oriented in a direction opposite from the first spin S1 are bent in a direction orthogonal to the current. For example, the first spin S1 may be bent in the z direction with respect to an advancing direction, and the second spin S2 may be bent in the −z direction with respect to an advancing direction.

A general Hall effect and the spin Hall effect are the same in that moving (traveling) charge (electrons) is bent in the moving (traveling) direction. On the other hand, the two effects are greatly different in that the normal Hall effect is that charged particles moving in a magnetic field receive a Lorentz force and are bent in the moving direction whereas the spin Hall effect is that, even when a magnetic field is not present, a traveling direction of a spin is bent due to traveling of electrons (the flow of a current).

In non-magnetic materials (materials that are not ferromagnetic materials), since the number of electrons of the first spin S1 is the same as the number of electrons of the second spin S2, the number of electrons of the first spin S1 oriented in the +z direction in the drawing is the same as the number of electrons of the second spin S2 oriented in the −z direction. In this case, the flows of charge cancel each other out and the amount of current is zero. A spin current that does not accompany a current is particularly referred to as a pure spin current.

When the flow of electrons of the first spin S1 is represented as $J_\uparrow$, the flow of electrons of the second spin S2 is represented as $J_\downarrow$, and the spin current is represented as $J_S$, it is defined that $J_S=J_\uparrow-J_\downarrow$. The spin current $J_S$ flows in the z direction in the drawing. In FIG. 1, the first ferromagnetic layer 1A to be described later is present on an upper surface of the spin-orbit torque wiring 2. Therefore, spins are injected into the first ferromagnetic layer 1A.

The spin-orbit torque wiring 2 is formed of any one of metals, alloys, intermetallic compounds, metal borides, metal carbides, metal silicides, and metal phosphides having a function of generating a spin current due to the spin Hall effect when a current flows.

The main component of the spin-orbit torque wiring 2 is preferably a non-magnetic heavy metal. Here, heavy metals mean metals having the specific weight of yttrium or higher. The non-magnetic heavy metals are preferably non-magnetic metals of which the atomic number is 39 or higher and which have d or f electrons at the outermost shell. These non-magnetic metals have a large spin-orbit interaction that induces the spin Hall effect.

Electrons generally move in an opposite direction from a current regardless of the orientation of the spin. In contrast, non-magnetic metals having a large atomic number and having d or f electrons at the outermost shell have a large spin-orbit interaction and a strong spin Hall effect acts thereupon. Due to this, the moving direction of electrons depends on the orientation of the spin of the electrons. Therefore, a spin current JS is easily generated in these non-magnetic heavy metals.

The spin-orbit torque wiring 2 may contain magnetic metals. Magnetic metals mean ferromagnetic metals or antiferromagnetic metals. When a very small amount of magnetic metal is contained in non-magnetic metals, the magnetic metal may scatter the spin. When the spin scatters, the spin-orbit interaction is enhanced and the generation efficiency of a spin current with respect to a current increases. A main component of the spin-orbit torque wiring 2 may be formed of only antiferromagnetic metal.

On the other hand, if the amount of added magnetic metal is too large, the generated spin current is scattered by the added magnetic metal and the effect that the spin current decreases strengthens. Due to this, the molar ratio of the added magnetic metal is preferably sufficiently smaller than a total molar ratio of elements that form the spin-orbit torque wiring. The molar ratio of the added magnetic metal is preferably 3% or smaller with respect to the total amount of constituent elements.

The spin-orbit torque wiring 2 may contain a topological insulator. The topological insulator is a substance of which the inner part is an insulator or a high-resistance member and of which the surface is a spin-polarized metal. An internal magnetic field is formed in this substance due to the spin-orbit interaction. Therefore, a new topological phase is obtained due to the spin-orbit interaction even when there is no external magnetic field. This substance is a topological insulator, and it is possible to generate a pure spin current with high efficiency due to a strong spin-orbit interaction and destruction of reversal symmetry at an edge.

Preferable examples of the topological insulator include SnTe, $Bi_{1.5}Sb_{0.5}Te_{1.7}Se_{1.3}$, $TlBiSe_2$, $Bi_2Te_3$, $Bi_{1-x}Sb_x$, and $(Bi_{1-x}Sb_x)_2Te_3$. These topological insulators can generate a spin current with high efficiency.

<Device Portion>

The device portion 1 includes a first ferromagnetic layer 1A, a second ferromagnetic layer 1B, and a non-magnetic layer 1C sandwiched between the ferromagnetic layers 1A and 1B. The device portion 1 is stacked in a second direction (the z direction) crossing the spin-orbit torque wiring 2.

The device portion 1 is configured such that the resistance thereof changes when the relative angle between a magnetization $M_{1A}$ of the first ferromagnetic layer 1A and a magnetization $M_{1B}$ of the second ferromagnetic layer 1B changes. The magnetization $M_{1B}$ of the second ferromagnetic layer 1B is fixed to one direction (the z direction), and the direction of the magnetization $M_{1A}$ of the first ferromagnetic layer 1A changes in relation to the magnetization $M_{1B}$. The second ferromagnetic layer 1B may sometimes be referred to as a fixed layer, a reference layer, or the like, and the first ferromagnetic layer 1A is sometimes expressed as a free layer, a recording layer, or the like. In application to coercive force difference-type (pseudo spin valve-type) MRAMs, the coercive force of the second ferromagnetic layer 1B is larger than the coercive force of the first ferromagnetic layer 1A. In application to exchange bias-type (spin valve-type) MRAMs, the magnetization $M_{1B}$ of the second ferromagnetic layer 1B is fixed by exchange coupling with an antiferromagnetic layer.

A stacking structure of the device portion 1 may employ a stacking structure of an existing magnetoresistance effect element. For example, each layer may be made up of a plurality of layers and may include another layer such as an antiferromagnetic layer for fixing the magnetization direction of the second ferromagnetic layer 1B. The second ferromagnetic layer 1B is referred to as a fixing layer or a reference layer and the first ferromagnetic layer 1A is referred to as a free layer, a storage layer, or the like.

The first and second ferromagnetic layers 1A and 1B may be a perpendicular magnetization film in which the easy axis of magnetization of the magnetizations $M_{1A}$ and $M_{1B}$ is oriented in the z direction and may be an in-plane magnetization film in which the easy axis of magnetization is oriented in an xy in-plane direction.

A ferromagnetic material may be used for the first and second ferromagnetic layers 1A and 1B. For example, a metal selected from the group consisting of Cr, Mn, Co, Fe, and Ni, an alloy containing one or more of these metals, an alloy containing these metals and at least one or more elements from B, C, and N, and the like can be used. Specifically, Co—Fe, Co—Fe—B, and Ni—Fe can be used. When the first ferromagnetic layer 1A is an in-plane magnetization film, it is preferable to use Co—Ho alloys ($CoHo_2$), Sm—Fe alloys ($SmFe_{12}$), and the like, for example.

When a Heusler alloy such as $Co_2FeSi$ is used in at least one of the first and second ferromagnetic layers 1A and 1B, a stronger magnetoresistance is obtained. A Heusler alloy contains intermetallic compounds having a chemical composition of $X_2YZ$, where X is a transition metal element or a noble metal element from the Co, Fe, Ni, or Cu groups of the periodic table, Y is transition metal from the Mn, V, Cr, or Ti groups or the types of element for X, and Z is a typical element of Groups III to V. For example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like can be used.

A layer formed of an antiferromagnetic material such as IrMn or PtMn may be stacked on the second ferromagnetic layer 1B. When a synthetic ferromagnetic coupling structure is employed, it is possible to alleviate the influence on the first ferromagnetic layer 1A, of the leakage magnetic field of the second ferromagnetic layer 1B.

Known materials can be used in the non-magnetic layer 1C. For example, when the non-magnetic layer 1C is formed of an insulator (when the layer is a tunneling barrier layer), $Al_2O_3$, $SiO_2$, MgO, $MgAl_2O_4$, and the like can be used as a material thereof. Besides these materials, materials in which some of Al, Si, and Mg of the oxides are replaced with Zn, Be, or the like can be also used. Among these materials, since MgO and $MgAl_2O_4$ are materials that can realize coherent tunneling, it is possible to inject spins efficiently.

The device portion 1 may have other layers. The device portion 1 may have a base layer on a surface on the side opposite to the non-magnetic layer 1C of the first ferromagnetic layer 1A. A layer arranged between the spin-orbit torque wiring 2 and the first ferromagnetic layer 1A preferably does not scatter the spins propagating from the spin-orbit torque wiring 2. For example, silver, copper, magnesium, aluminum, and the like are known to have a long spin diffusion length of 100 nm or more and rarely scatter the spins. The thickness of this layer is preferably equal to or smaller than a spin diffusion length of a substance that constitutes the layer. When the thickness of the layer is equal to or smaller than the spin diffusion length, it is possible to transfer the spins propagating from the spin-orbit torque wiring 2 sufficiently to the first ferromagnetic layer 1A.

(Domain Wall Motion-Type Magnetic Recording Device)

Figure 2:
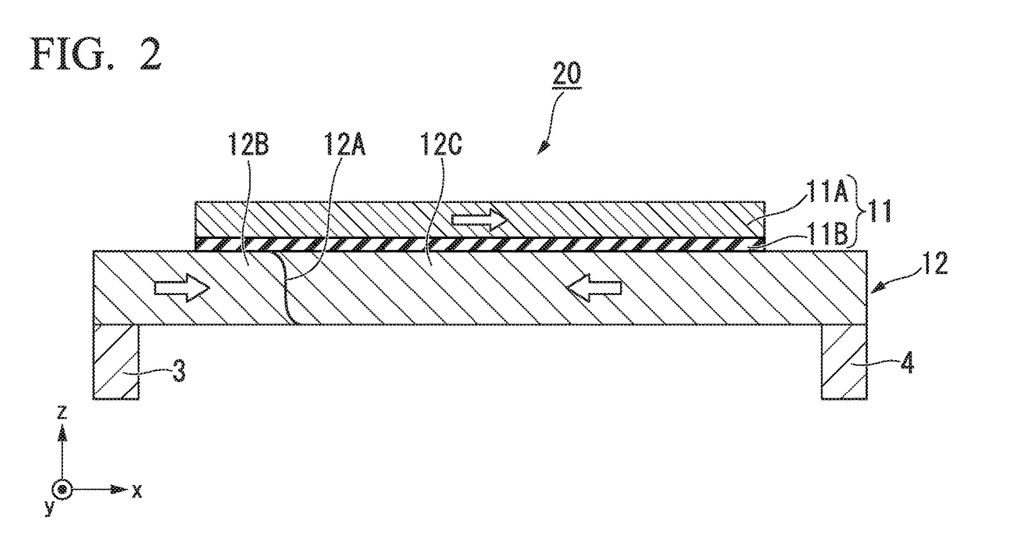
FIG. 2 is a cross-sectional schematic diagram of a domain wall motion-type magnetic recording device which is an example of the spin device according to the present embodiment.

FIG. 2 is a cross-sectional schematic diagram of a domain wall motion-type magnetic recording device 20 which is an example of the spin device according to the present embodiment. The domain wall motion-type magnetic recording device 20 shown in FIG. 2 includes a device portion 11 and a magnetic recording layer (a conducting portion) 12. A first electrode 3 and a second electrode 4 having conductive properties are provided at positions on the magnetic recording layer 12 between which the device portion 11 is interposed.

<Device Portion>

The device portion 11 includes a first ferromagnetic layer 11A and a non-magnetic layer 11B. The same layers as those used for the spin-orbit torque-type magnetoresistance effect element 10 shown in FIG. 1 can be used as the first ferromagnetic layer 11A and the non-magnetic layer 11B.

<Magnetic Recording Layer>

The magnetic recording layer 12 extends in the x direction. The magnetic recording layer 12 has a domain wall 12A therein. The domain wall 12A is a boundary between a first magnetic domain 12B and a second magnetic domain 12C having magnetizations in opposite directions. In the domain wall motion-type magnetic recording device 20 shown in FIG. 2, the orientation of the magnetization of the first magnetic domain 12B is oriented in the +x direction and the orientation of the magnetization of the second magnetic domain 12C is oriented in the −x direction.

The domain wall motion-type magnetic recording device 20 records multi-valued data depending on the position of the domain wall 12A of the magnetic recording layer 12. The data recorded in the magnetic recording layer 12 is read as a change in resistance in the stacking direction of the first ferromagnetic layer 11A and the magnetic recording layer 12. When the domain wall 12A moves, the ratio between the first and second magnetic domains 12B and 12C in the magnetic recording layer 12 changes. The magnetization of the first ferromagnetic layer 11A is the same direction as (parallel to) the magnetization of the first magnetic domain 12B and is the direction opposite to (anti-parallel to) the magnetization of the second magnetic domain 12C. When the domain wall 12A moves in the x direction and the area of the first magnetic domain 12B in a portion overlapping the first ferromagnetic layer 11A when seen from the z direction increases, the resistance of the domain wall motion-type magnetic recording device 20 decreases. In contrast, when the domain wall 12A moves in the −x direction and the area of the second magnetic domain 12C in a portion overlapping the first ferromagnetic layer 11A when seen from the z direction increases, the resistance of the domain wall motion-type magnetic recording device 20 increases. The resistance of the domain wall motion-type magnetic recording device 20 is measured between an upper electrode electrically connected to the first ferromagnetic layer 11A and the first or second electrode 3 or 4.

The domain wall 12A moves when a current is passed or an external magnetic field is applied in an extending direction of the magnetic recording layer 12. For example, when a current pulse is applied from the first electrode 3 to the second electrode 4, the first magnetic domain 12B spreads toward the second magnetic domain 12C and the domain wall 12A moves toward the second magnetic domain 12C. That is, by setting the direction and the strength of a current passed to the first and second electrodes 3 and 4, the position of the domain wall 12A is controlled such that data is written to the domain wall motion-type magnetic recording device 20.

The magnetic recording layer 12 is formed of a magnetic material. The magnetic material that forms the magnetic recording layer 12 may employ the same material as that used for the first ferromagnetic layer 11A. Moreover, the magnetic recording layer 12 preferably includes at least one element selected from the group consisting of Co, Ni, Pt, Pd, Gd, Tb, Mn, Ge, and Ga. For example, a laminated film of Co and Ni, a laminated film of Co and Pt, a laminated film of Co and Pd, a MnGa-based material, a GdCo-based material, and a TbCo-based material can be used. A ferrimagnetic material such as a MnGa-based material, a GdCo-based material, and a TbCo-based material has a small saturation magnetization and can decrease a threshold current necessary for moving a domain wall. Moreover, a laminated film of Co and Ni, a laminated film of Co and Pt, and a laminated film of Co and Pd have a large coercive force and can reduce the moving speed of a domain wall.

Hereinabove, a specific example of a predetermined spin device has been described. The spin-orbit torque-type magnetoresistance effect element 10 and the domain wall motion-type magnetic recording device 20 are the same in that a writing current is passed to the conducting portion 2 or 12 extending in the direction crossing the device portion 1 or 11 during data writing. The spin device is not limited to the spin-orbit torque-type magnetoresistance effect element 10 and the domain wall motion-type magnetic recording device 10 as long as the spin device passes a writing current to a conducting portion extending in the direction crossing the device portion during data writing.

(Data Writing)

A data writing method according to the present embodiment applies an energy equal to or smaller than an energy represented by the following relational expression (1) in the x direction of the conducting portion 2 or 12 when applying an energy for writing data to the three-terminal-type spin device.

$$E = (A + Bt^C)^{-1} + D \quad (1)$$

In the relational expression (1), E is an energy ($\times 10^{-3}$ m$\Omega$A$^2$) applied to the conducting portion, t is a pulse width of an applied pulse, and A, B, C, and D are constants determined by the non-magnetic layer 1C or 11B.

When the energy applied to the conducting portion 2 or 12 of the three-terminal-type spin device is equal to or smaller than the energy represented by the relational expression (1), it is possible to stably record data in the spin device.

In the three-terminal-type spin device, it is not necessary to pass a current in the stacking direction of the device portion 1 or 11 when writing data. Due to this, it was thought that there was no limitation on the energy applied to the conducting portion 2 or 12 unless an energy that causes electromigration of a wire material that forms the conducting portion 2 or 12 was applied.

However, as a result of actual examination, it was found that the resistance of the device portion 1 or 11 decreased to a certain level when an energy equal to or smaller than that represented by the relational expression (1) was repeatedly applied to the conducting portion 2 or 12 (repeated writing was performed). Although the cause thereof is not clear, it is thought that, if a large potential difference is applied in the x direction of the conducting portion 2 or 12, a potential difference also occurs between an end surface close to the first electrode 3 of the device portion 1 or 11 and the end surface close to the second electrode 4, and the insulating properties of the non-magnetic layer 1C or 11B deteriorate. When the resistance of the device portion 1 or 11 changes during use, it is not possible to detect change in resistance appropriately according to a difference in relative angle of magnetization.

The constants A, B, C, and D in the relational expression (1) are determined by the material that forms the non-magnetic layer 1C or 11B. For example, in the relational expression (1), A=−0.18264, B=13.2554, C=0.22749, and D=0.2 when the non-magnetic layer 1C or 11B is MgO, and A=−0.13792, B=6.98, C=0.20832, and D=0.2 when the non-magnetic layer is MgAl$_2$O$_4$.

Here, the material that forms the non-magnetic layer 1C or 11B is not limited to MgO and MgAl$_2$O$_4$ for which the constants A, B, C, and D have been calculated. MgO has an NaCl-type crystal structure and MgAl$_2$O$_4$ has a spinel-type crystal structure. Since these two materials are represented by the same relational expression (1) although they have different crystal structures, this can be generalized for materials other than MgO and MgAl$_2$O$_4$. When materials other than MgO and MgAl$_2$O$_4$ are used for the non-magnetic layer, a value at which the resistance of the device portion 1 or 11 decreases to a certain level is calculated with an actual device, and the constants A, B, C, and D are defined by fitting. The range of applicable energy is defined by the constants A, B, C, and D being calculated.

When data is to be written to a three-terminal-type spin device, it is preferable that the pulse width of an applied pulse be 1 sec or shorter and the energy applied to the conducting portion 2 or 12 be equal to or smaller than 0.2 m$\Omega$A$^2$.

As described above, according to the data writing method of the present embodiment, it is possible to prevent a large energy from being applied in the x direction of the three-terminal-type spin device. As a result, it is possible to prevent the resistance of a device portion from decreasing abruptly and to stably write data.

<Spin Device Manufacturing Method>

A spin device manufacturing method according to the present embodiment includes a first step of manufacturing a spin device and a second step of inspecting the spin device.

(First Step)

The first step has a step of forming a conducting portion extending in a first direction and a step of forming a device portion including a non-magnetic layer and a ferromagnetic material on one surface of the conducting portion.

The spin device is manufactured using a photolithography technique or the like when the spin device is the spin-orbit torque-type magnetoresistance effect element 10 (FIG. 1) or the domain wall motion-type magnetic recording device (FIG. 2).

For example, the spin-orbit torque-type magnetoresistance effect element is manufactured by the following procedure. First, a through-hole is formed in a substrate and the through-hole is filled with a conductive material whereby the first and second electrodes 3 and 4 are formed. Subsequently, a layer serving as a base of the spin-orbit torque wiring 2 serving as a conducting portion is stacked to form a wire using a photolithography technique. Finally, a layer serving as a base of the first ferromagnetic layer 1A, a layer serving as a base of the non-magnetic layer 1C, and a layer serving as a base of the second ferromagnetic layer 1B are stacked on each other to form the device portion 1 using a photolithography technique.

The domain wall motion-type magnetic recording device 20 can be manufactured in the same manner except that the configuration of the layers thereof is different from that of the layers stacked when manufacturing the device portion 11. Due to this, the domain wall motion-type magnetic recording device 20 can be manufactured by the same procedure as the above-described steps.

The spin devices may be manufactured individually and a number of devices may be manufactured at a time on a wafer. From the viewpoint of manufacturing efficiency, it is preferable to manufacture a number of devices at a time on a wafer.

(Second Step)

In the second step, when a pulse width of an applied pulse is t, an energy equal to or smaller than an energy represented by the relational expression (1) is applied in the first direction of the conducting portion of the spin device.

As described above, in principle, even when an energy represented by the relational expression (1) is applied to the spin device, the insulating properties of the non-magnetic layer 1C or 11B are maintained. On the other hand, this is not true when defects or the like are included in the spin device. That is, when an energy equal to or smaller than the energy represented by the relational expression (1) is applied, the resistance of the device portion 1 or 11 may decrease to a predetermined level.

Therefore, by applying an energy represented by the relational expression (1) to the spin device, it is possible to screen for a non-defective spin device and a defective spin device using the resistance of the device portion 1 or 11. The device resistance decreases abruptly when an energy is applied to a defective spin device.

When screening accuracy is to be increased, the energy represented by the relational expression (1) is applied to the spin device. When a margin is to be provided, an energy equal to or smaller than the energy represented by the relational expression is applied to the spin device.

The energy may be applied in a wafer state where a plurality of devices is present on the wafer and may be applied after the respective devices manufactured on the wafer are diced into chips. In order to enhance manufacturing efficiency, it is preferable to apply a pulse current to the respective devices present on a wafer.

As described above, according to the spin device manufacturing method of the present embodiment, it is possible to easily eliminate defective products. Several thousands of spin devices may be manufactured on one wafer, and if it is possible to easily eliminate defective products, the manufacturing efficiency of spin devices is improved. According to a spin device inspection method of the present embodiment, it is possible to easily screen for non-defective products and defective products.

<Magnetoresistance Effect Element>

A magnetoresistance effect element according to the present embodiment includes a spin device and an energy source. The above-described spin device is used for the spin device. The energy source can apply an energy equal to or smaller than an energy E represented by the relational expression (1) in the x direction of the conducting portion of the spin device when a pulse width of an applied pulse is t. The magnetoresistance effect element according to the present embodiment may have a control unit connected to the energy source. The control unit determines an amount of energy output from the energy source from the relational expression (1) according to the pulse width of an applied pulse.

While a preferred embodiment of the present invention has been described in detail, the present invention is not limited to a specific embodiment, and various modifications and changes can be made within the scope of the present invention described in the claims.

EXAMPLES

Example 1

The spin-orbit torque-type magnetoresistance effect element 10 shown in FIG. 1 was fabricated. A layer of tungsten (W) was laminated to a thickness of 3 nm on a thermally oxidized silicon substrate. The tungsten layer was processed to a width of 50 nm and a length of 300 nm whereby the spin-orbit torque wiring 2 was obtained. The periphery of the spin-orbit torque wiring 2 was coated with an insulating film formed of silicon oxide.

Subsequently, layers of CoFeB (1 nm thick), $MgAl_2O_4$ (3 nm thick), CoFeB (1 nm thick), Ta (0.4 nm thick), [Co (0.4 nm thick)/Pt (0.8 nm thick)]$_4$, Co (0.4 nm thick), Ru (0.4 nm thick), [Co (0.4 nm thick)/Pt (0.8 nm thick)]$_5$, Co (0.4 nm thick), and Pt (10 nm thick) were formed in that order on the spin-orbit torque wiring 2 and the insulating film. The fabricated layers were annealed at 350° C. and processed into a square shape of 50 nm by 50 nm whereby the device portion 1 was fabricated. The CoFeB layer stacked first corresponds to the first ferromagnetic layer 1A, the $MgAl_2O_4$ layer corresponds to the non-magnetic layer 1C, and a SAF (synthetic antiferromagnetic) structure corresponds to the second ferromagnetic layer 1B. The first ferromagnetic layer 1A is a perpendicular magnetization film.

A pulse current was applied between the first and second electrodes 3 and 4 of the spin-orbit torque-type magnetoresistance effect element 10 manufactured in the above-described procedure. The pulse width of the applied pulse current was 10 nsec. The applied energy was increased gradually. The device resistance decreased abruptly at $80 \times 10^{-3}$ $\Omega A^2$ (a breakdown occurred).

Figure 3:
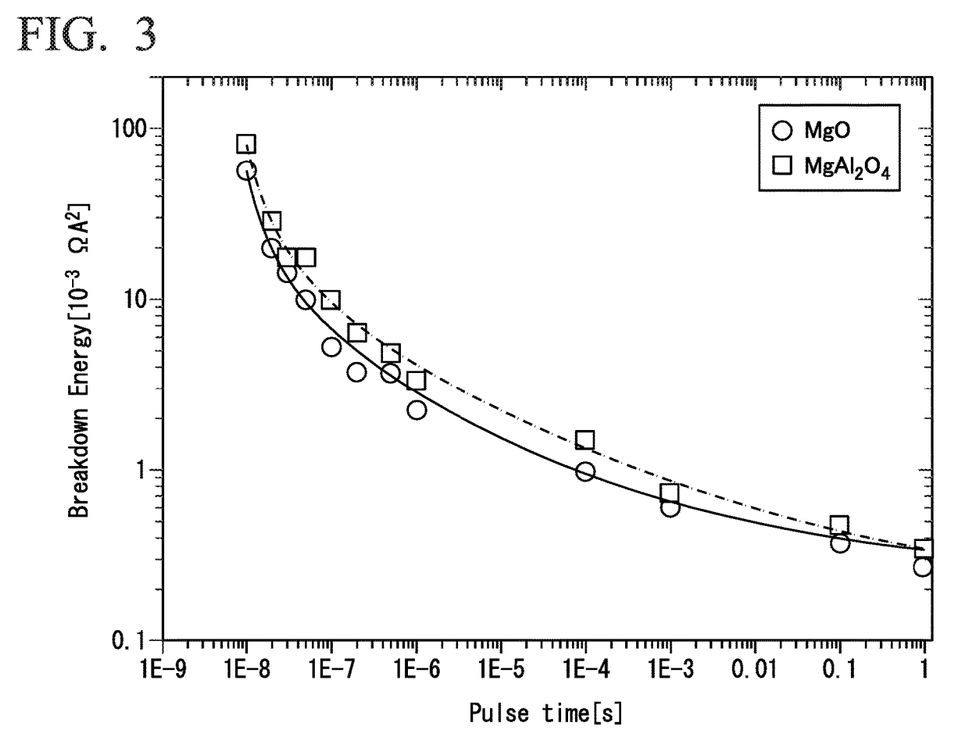
FIG. 3 shows a relationship between a pulse width of an applied pulse and an energy at which breakdown occurs.

The same examination was conducted while changing the applied pulse width. FIG. 3 shows a relationship between a pulse width of an applied pulse and an energy at which a breakdown occurs. The graph for $MgAl_2O_4$ shown in FIG. 3 could be fitted to $E=(-0.13792+6.98\ t^{0.20832})^{-1}+0.2$.

Example 2

Example 2 is different from Example 1 in that the non-magnetic layer 1C is changed to MgO. As shown in FIG. 3, a curve similar to Example 1 was obtained when the non-magnetic layer 1C was MgO. The graph for MgO shown in FIG. 3 could be fitted to $E=(-0.18264+13.2554\ t^{0.22749})^{-1}+0.2$.

Example 3

Example 3 is different from Example 1 in that the thickness of the non-magnetic layer was 2 nm and the plan-view size of the device portion 1 was 100 nm by 100 nm. A fitting curve similar to Example 1 was obtained for Example 3. That is, it was confirmed that the thickness and the size of the non-magnetic layer did not have any influence on a breakdown.

REFERENCE SIGNS LIST 1, 11 Device portion
1A, 11A First Ferromagnetic layer
1B Second Ferromagnetic layer
1C, 11B Non-magnetic layer
2 Spin-orbit torque wiring
3 First Electrode
4 Second Electrode
10 Spin-orbit torque-type magnetoresistance effect element
12 Magnetic recording layer
12A Domain wall
12B First Magnetic domain
12C Second Magnetic domain
20 Domain wall motion-type magnetic recording device

What is claimed is:
1. A data writing method in a spin device including a conducting portion extending in a first direction and a device portion stacked on one surface of the conducting portion and including a non-magnetic layer and a ferromagnetic layer,
wherein an energy equal to or smaller than an energy E represented by a relational expression (1) is applied in the first direction of the conducting portion when a pulse width of an applied pulse is t:

$$E=(A+Bt^C)^{-1}+D \qquad (1)$$

in the relational expression (1), A, B, C, and D are constants determined by the non-magnetic layer.

2. The data writing method according to claim 1,
wherein the non-magnetic layer is MgO and in the relational expression (1), A=−0.18264, B=13.2554, C=0.22749, and D=0.2, or
the non-magnetic layer is MgAl$_2$O$_4$ and in the relational expression (1), A=−0.13792, B=6.98, C=0.20832, and D=0.2.

3. The data writing method according to claim 1,
wherein the pulse width is 1 sec or shorter and the energy applied in the first direction of the conducting portion is 0.2 mΩA$^2$ or smaller.

4. The data writing method according to claim 1,
wherein the conducting portion is a spin-orbit torque wiring, and the device portion includes a first ferromagnetic layer, a second ferromagnetic layer, and a non-magnetic layer interposed between the first and second ferromagnetic layers.

5. The data writing method according to claim 1,
wherein the conducting portion is a magnetic recording layer having a domain wall, and the device portion has a non-magnetic layer and a third ferromagnetic layer arranged in that order from the magnetic recording layer.

6. An inspection method in a spin device including a conducting portion extending in a first direction and a device portion stacked on one surface of the conducting portion and including a non-magnetic layer and a ferromagnetic layer,
wherein an energy equal to or smaller than an energy E represented by a relational expression (1) is applied in the first direction of the conducting portion when a pulse width of an applied pulse is t:

$$E=(A+Bt^C)^{-1}+D \qquad (1)$$

in the relational expression (1), A, B, C, and D are constants determined by the non-magnetic layer.

7. The inspection method according to claim 6,
wherein the non-magnetic layer is MgO and in the relational expression (1), A=−0.18264, B=13.2554, C=0.22749, and D=0.2, or
the non-magnetic layer is MgAl$_2$O$_4$ and in the relational expression (1), A=−0.13792, B=6.98, C=0.20832, and D=0.2.

8. A spin device manufacturing method including a step of inspecting the spin device by the inspection method according to claim 6.

9. A magnetoresistance effect element comprising:
a spin device including a conducting portion extending in a first direction and a device portion stacked on one surface of the conducting portion and including a non-magnetic layer and a ferromagnetic layer; and
an energy source capable of applying an energy equal to or smaller than an energy E represented by a relational expression (1) in the first direction of the conducting portion when a pulse width of an applied pulse is t:

$$E=(A+Bt^C)^{-1}+D \qquad (1)$$

in the relational expression (1), A, B, C, and D are constants determined by the non-magnetic layer.

10. The data writing method according to claim 2,
wherein the pulse width is 1 sec or shorter and the energy applied in the first direction of the conducting portion is 0.2 mΩA$^2$ or smaller.

11. The data writing method according to claim 2,
wherein the conducting portion is a spin-orbit torque wiring, and the device portion includes a first ferromagnetic layer, a second ferromagnetic layer, and a non-magnetic layer interposed between the first and second ferromagnetic layers.

12. The data writing method according to claim 3,
wherein the conducting portion is a spin-orbit torque wiring, and the device portion includes a first ferromagnetic layer, a second ferromagnetic layer, and a non-magnetic layer interposed between the first and second ferromagnetic layers.

13. The data writing method according to claim 2,
wherein the conducting portion is a magnetic recording layer having a domain wall, and the device portion has a non-magnetic layer and a third ferromagnetic layer arranged in that order from the magnetic recording layer.

14. The data writing method according to claim 3,
wherein the conducting portion is a magnetic recording layer having a domain wall, and the device portion has a non-magnetic layer and a third ferromagnetic layer arranged in that order from the magnetic recording layer.

* * * * *